(12) United States Patent
Vanderhaegen et al.

(10) Patent No.: US 7,924,195 B2
(45) Date of Patent: Apr. 12, 2011

(54) HARDWARE-EFFICIENT RECONSTRUCTION FOR PERIODIC NON-UNIFORMLY SAMPLED SIGNALS

(75) Inventors: Johan Vanderhaegen, Palo Alto, CA (US); Christoph Lang, Los Altos, CA (US); Frank Hofmann, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/395,505

(22) Filed: Feb. 27, 2009

(65) Prior Publication Data

US 2010/0045501 A1    Feb. 25, 2010

Related U.S. Application Data

(63) Continuation of application No. 11/786,064, filed on Apr. 9, 2007, now Pat. No. 7,525,466.

(51) Int. Cl.
*H03M 1/66* (2006.01)
(52) U.S. Cl. ........................................ 341/144; 375/347
(58) Field of Classification Search .................. 341/144; 375/347, 146, 147, 206, 267, 340, 349
See application file for complete search history.

(56) References Cited

U.S. PATENT DOCUMENTS

| 7,430,257 B1 * | 9/2008 | Shattil ........................... 375/347 |
| 7,525,466 B2 * | 4/2009 | Vanderhaegen et al. ...... 341/144 |

* cited by examiner

*Primary Examiner* — Joseph Lauture
(74) *Attorney, Agent, or Firm* — Dergosits & Noah LLP; Geoffrey T. Staniford (57) ABSTRACT

Method and apparatus for signal reconstruction enabling the sharing of analog-to-digital converter resources among signals. Embodiments include a signal reconstruction method that allows reconstruction of multiple non-uniformly sampled signals while avoiding unwanted side effects such as aliasing.

9 Claims, 7 Drawing Sheets

HARDWARE-EFFICIENT RECONSTRUCTION FOR PERIODIC NON-UNIFORMLY SAMPLED SIGNALS

RELATED APPLICATIONS

This application is a continuation of U.S. patent application Ser. No. 11/786,064, filed Apr. 9, 2007, now U.S. Pat. No. 7,525,466, which is hereby incorporated by reference in its entirety.

TECHNICAL FIELD

The disclosed embodiments relate to methods and apparatus for digitally reconstructing a signal, and more particularly for reconstructing a signal which has been subjected to periodic non-uniform sampling.

BACKGROUND OF THE DISCLOSURE

Future wireless receivers will need to be able to receive signals from multiple sources simultaneously. For example, in automotive multi-media receivers, it is highly desirable to receive FM radio signals with embedded traffic information together with Digital Audio Broadcast (DAB) signals with superior audio quality.

Because of the need for concurrent reception, the analog portion of the receiver chain needs to be duplicated for each of the simultaneously received signals. The individual receiver chains can be optimized for a specific wireless communication standard.

In between the analog portion of the receiver chain and the digital portion of the receiver chains, sits a so-called Analog-to-Digital Converter (ADC). This ADC translates the received signal into a digital representation for further processing. If the entire receiver consists of multiple chips, then this ADC is most often integrated with the digital portion of the receiver. This is also the case when the receiver is integrated as a single chip.

For concurrent reception, it would be desirable to share this ADC between the multiple receiver paths, and to digitally correct any of the artifacts introduced by this sharing. The area occupied by digital circuits for a specific functionality keeps decreasing thanks to constant and rapid progress in semiconductor manufacturing. In contrast to digital circuits, which are significantly benefited by this progress, analog circuits realize little or no benefit. As this manufacturing progress continuous, the incentive grows to replace analog circuits by digital circuits where possible.

When an ADC is shared between multiple receiver paths, it can be necessary to take samples from the different signals at different rates. This subjects at least one of the signals to periodic non-uniform sampling, because the ADC needs a constant time to convert a single sample.

Figure 1:
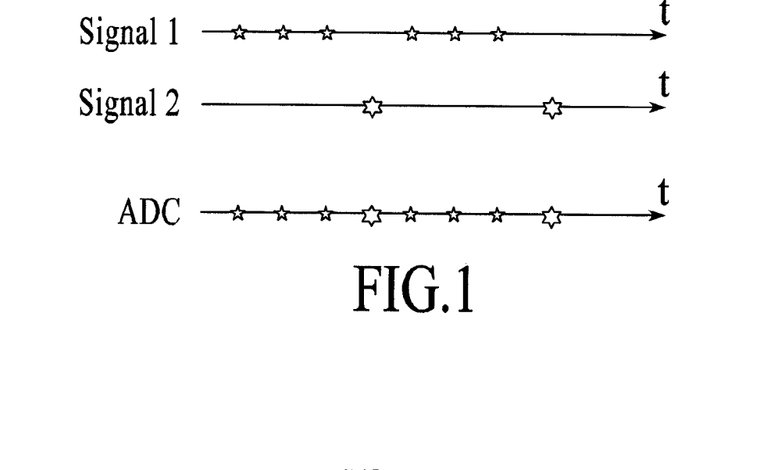
FIG. 1 is a diagram illustrating a prior art ADC sharing concept with different sampling rates, according to an embodiment.

To illustrate this statement, consider the case where the first of two signals needs to be sampled on average three times faster then the second signal. Referring to FIG. 1, the ADC takes three samples from the first signal and then one sample from the second signal. Each of these samples is processed by the ADC in the same amount of time. The samples of the second signal are evenly spaced. The samples of the first signal, however, are non-uniform in time, but they are uniform in a periodic fashion: after every group of 3 samples, the sample period changes briefly to twice the regular sample period.

This non-uniform sampling introduces artifacts into the signal, and as such, the sharing idea cannot be used without impractical constraints on the signal. This is especially true for the reception of wireless signals, where weak wanted signals are adjacent to strong unwanted signals. Non-uniform sampling introduces aliasing and causes the unwanted adjacent signals to fold onto the weak wanted signal.

Currently, techniques exist to remove the uniform sampling artifacts (e.g., Marziliano, P. and M. Vetterli (2000). *Fast reconstruction in periodic nonuniform sampling of discrete-time band-limited signals*. Proceedings of 2000 International Conference on Acoustics. Speech and Signal Processing, Istanbul, Turkey, IEEE).

However, these techniques have been developed for use on a general purpose computer in the form of software, and cannot be implemented efficiently using dedicated digital circuitry. The existing techniques use matrix operations and thus have substantial memory and processing time requirements. Only if the signal reconstruction can be implemented efficiently using digital circuitry, is it economical to replace one or more ADC's by a single ADC with digital reconstruction circuitry.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

DETAILED DESCRIPTION

Embodiments described herein include a technique for digitally reconstructing a signal which has been subjected to periodic non-uniform sampling. This technique can be implemented efficiently in dedicated digital hardware. According to embodiments described herein, the technique enables an analog-to-digital converter (ADC) to be shared between paths with different sampling rates. This provides significant advantages, for example by minimizing both the area (production cost) and the power consumption (operating cost) required by the hardware.

An application of the described embodiments includes wireless receivers, but the invention as claimed is not so limited. For example, embodiments are equally applicable to sensor systems.

According to an embodiment, two components in particular provide reduction of hardware complexity: a mathematical decomposition of part of the reconstruction (with reference for example to Optimization of the reconstruction and equation (4) below), and an optimized combination of the decomposition with FFT and IFFT blocks (with reference for example to Implementation optimized using FFT structure below).

The mathematical foundation assumes that part of the frequency spectrum of the signal is known to be zero. Two cases are of particular interest because they yield a simple implementation: the non-zero part centered symmetrically either around 0 Hz or around $\pm f_s/4$, with half of the spectrum between $-f_s/2$ Hz and $+f_s/2$ assumed to be zero. $f_s$ denotes the sampling frequency.

A signal centered around 0 Hz or $f_s/4$ is of high interest to wireless communications, since it is very common to either translate the signal to DC in the analog part of the receiver before sampling by the ADC, or to translate the signal to $f_s/4$ so that it can be easily mixed down digitally to 0 Hz using the sequence $+1, -1, +1, -1, \ldots$.

Mathematical Description of the Technique

General Signal Reconstruction

A mathematical description of a technique for digitally reconstructing a signal according to an embodiment will now be described. Let N denote the total number of samples of a signal x, numbered $0, 1, \ldots, N-1$, of which only a subset is available. If the signal values are represented by the vector x, then the vector with the available samples can be written as $x(\mathcal{K})$, where $\mathcal{K}$ is the subset of the available samples.

Using the discrete Fourier transform (DFT) matrix, the frequency domain representation X of the time domain signal x can be calculated:

$$X = DFT_N x \quad (1)$$

The inverse transform is given by:

$$x = \frac{1}{N} DFT_N^* N \quad (2)$$

The method requires that a subset of the frequency domain values X are known to be zero. Let $X(\mathcal{M})$ denote the subset of the frequency domain values which are non-zero.

As is known (see, for example Marziliano and Vetterli (2000)), a non-uniformly sampled signal can be reconstructed using the following formula:

$$\hat{x}(\mathcal{M}) = DFT^*_N(\cdot, \mathcal{M})[DFT_N(\mathcal{M}, \mathcal{K}) DFT^*_N(\mathcal{K}, \mathcal{M})]^{-1} DFT_N(\mathcal{M}, \mathcal{K}) x(\mathcal{K}) \quad (3)$$

The signal can be fully reconstructed only if the number of elements in the set M is not larger than the number of elements in the set K. This condition can be mathematically expressed as $\#(\mathcal{M}) \leq \#(\mathcal{K})$, and it guarantees the full rank of the product of DFT matrices which are inverted in (3). The outer and inner DFT can be efficiently implemented using an FFT, but the multiplication with the inverted matrix may be problematic in hardware. The inverted matrix can be computed off-line, but even a matrix-vector multiplication poses a significant computational effort.

Optimization of the Reconstruction

In the previous section, a general reconstruction formula for non-uniformly sampled signal was given. For the case of periodically non-uniformly sampled signals, this formula can be simplified. This simplification enables a novel, efficient hardware implementation.

We will make three assumptions:

The time-domain input signal $x(\mathcal{K})$ can be divided in M periods of length K; in each period, the same phases are missing. Let K" indicate the number of missing samples.

The frequency-domain signal can be divided in K groups of length M, of which some are known to be zero. Let K'<K indicate the number of non-zero groups ($\#(\mathcal{M})$=MK')

The number of frequency-domain groups known to be zero, is larger than the number of missing time-domain samples per period. Then the requirement $\#(\mathcal{M}) \leq \#(\mathcal{K})$ translates to: K'+K"$\leq$K.

A first element of a signal reconstruction embodiment is the decomposition of part of the reconstruction equation (3), valid under the assumptions given above. The derivation of the decomposition is quite lengthy, and only the final result is stated here:

$$N[DFT_N(\mathcal{M}, \mathcal{K}) DFT^*_N(\mathcal{K}, \mathcal{M})]^{-1} = \quad (4)$$

$$P(\mathcal{M}, \mathcal{M}) \begin{bmatrix} D^{-1} & 0 & \cdots & 0 \\ 0 & D^{-1} & & \vdots \\ \vdots & & \ddots & 0 \\ 0 & \cdots & 0 & D^{-1} \end{bmatrix} P^*(\mathcal{M}, \mathcal{M})$$

where P is a permutation matrix, and the K'×K' matrix D depends on which phases in particular are missing from each period. If K' represents the set of non-zero samples in each phase of K samples, and M' the set of non-zero frequency domain groups of length M (with $\#(\mathcal{M})$=K'), then D can be written as follows:

$$D = \frac{1}{K} DFT_K(\mathcal{M}', \mathcal{K}') DFT^*_K(\mathcal{K}', \mathcal{M}') \quad (5)$$

This optimization of the reconstruction is very general and results in a greatly decreased computational effort: the D matrices are quite simple for low values of K, independent of the value of N, and the block matrix containing the sub-matrices D is block diagonal. For special cases, the inverse $D^{-1}$ can be easily calculated analytically, as will be shown in the following examples which are of particular interest.

Furthermore, depending on how the DFT are implemented, the permutation matrices may come "for free" (see Implementation optimized using FFT structure below).

Example

Skipping the First of K Samples

For the special case of skipping the first sample in each period of K samples, the K'×K' matrix D is given by:

$$D = \frac{1}{K}\begin{bmatrix} K-1 & -1 & \cdots & -1 \\ -1 & K-1 & & \vdots \\ \vdots & & \ddots & -1 \\ -1 & \cdots & -1 & K-1 \end{bmatrix} = I - \frac{11^T}{K} \quad (6)$$

The inverse of D can be easily calculated using the Sherman-Morrison formula:

$$D^{-1} = I + \frac{11^T}{K\left(1 - \frac{K'}{K}\right)} \quad (7)$$

For example, for K=4 (i.e. skipping 1 out of 4 samples), with K'=2, this yields:

$$D^{-1}\begin{bmatrix} 3/2 & 1/2 \\ 1/2 & 3/2 \end{bmatrix} = \begin{bmatrix} 1 & 0 \\ 0 & 1 \end{bmatrix} + \frac{1}{2}\begin{bmatrix} 1 & 1 \\ 1 & 1 \end{bmatrix} \quad (8)$$

Example

Skipping the First and K/2'th of K Samples

For the special case of skipping the first and the K/2'th of K samples (or equivalently, the first of K/2 samples), the K'×K' matrix D is given by:

$$D = \frac{1}{K}\begin{bmatrix} K-2 & 0 & -2 & \cdots \\ 0 & K-2 & 0 & \\ -2 & 0 & K-2 & \ddots \\ \vdots & & \ddots & \ddots \end{bmatrix} = I - \frac{11^T}{K} - \frac{\begin{bmatrix} 1 \\ -1 \\ \vdots \end{bmatrix}[1 \ -1 \ \cdots]}{K} \quad (9)$$

Again, the inverse of D can be calculated using the Sherman-Morrison formula:

$$D^{-1} = I + \frac{11^T}{K\left(1 - \frac{K'}{K}\right)} + \frac{\begin{bmatrix} 1 \\ -1 \\ \vdots \end{bmatrix}[1 \ -1 \ \cdots]}{K\left(1 - \frac{K'}{K}\right)} \quad (10)$$

For example, for K=8 (i.e. skipping the $1^{st}$ and the $5^{th}$ out of every 8 samples), with K'=4, this yields:

$$D^{-1} = \begin{bmatrix} 3/2 & 0 & 1/2 & 0 \\ 0 & 3/2 & 0 & 1/2 \\ 1/2 & 0 & 3/2 & 0 \\ 0 & 1/2 & 0 & 3/2 \end{bmatrix} \quad (11)$$

$$= \begin{bmatrix} 1 & 0 & 0 & 0 \\ 0 & 1 & 0 & 0 \\ 0 & 0 & 1 & 0 \\ 0 & 0 & 0 & 1 \end{bmatrix} + \frac{1}{2}\begin{bmatrix} 1 & 0 & 1 & 0 \\ 0 & 0 & 0 & 0 \\ 1 & 0 & 1 & 0 \\ 0 & 0 & 0 & 0 \end{bmatrix} + \frac{1}{2}\begin{bmatrix} 0 & 0 & 0 \\ 0 & 1 & 0 \\ 0 & 0 & 0 \\ 0 & 1 & 0 \end{bmatrix}$$

Skipping the $1^{st}$ and the $5^{th}$ out of every 8 sample is equivalent to skipping every $4^{th}$ sample, but it provides more freedom in the frequency domain to select which parts can be considered non-zero.

Application of the Technique to Wireless Systems

We will assume here that 1 in every 4 samples is missing due to ADC sharing, and the signal needs to be reconstructed using the method described above.

Reconstruction of a Signal Centered Around DC

Figure 2:
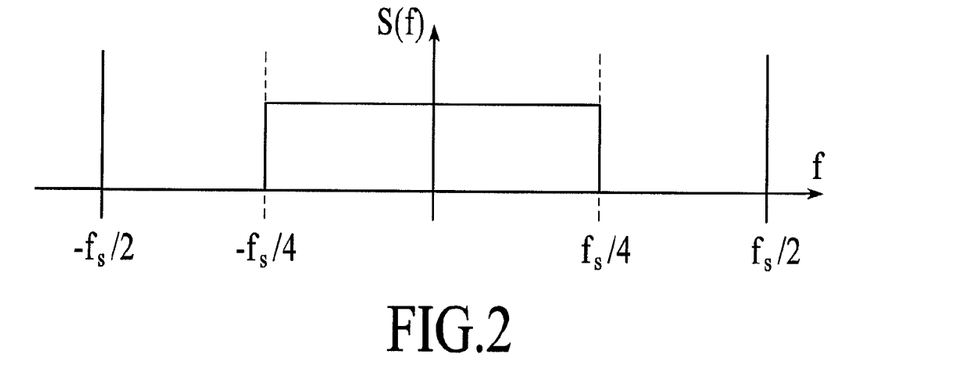
FIG. 2 is a diagram showing a spectrum centered around DC, according to an embodiment.

For a signal centered around DC, as illustrated in FIG. 2, the example titled Skipping the first of K samples with K=4 applies. The signal spectrum on $[-f_s/2, +f_s/2]$ can be divided in 4 parts ($[-f_s/2, -f_s/4]$, $[-f_s/4, 0]$, $[0, +f_s/4]$, $[+f_s/4, +f_s/2]$), of which only the spectrum in $[-f_s/4, +f_s/4]$ is considered non-zero.

Reconstruction of a Signal Centered Around $f_s/4$

Figure 3:
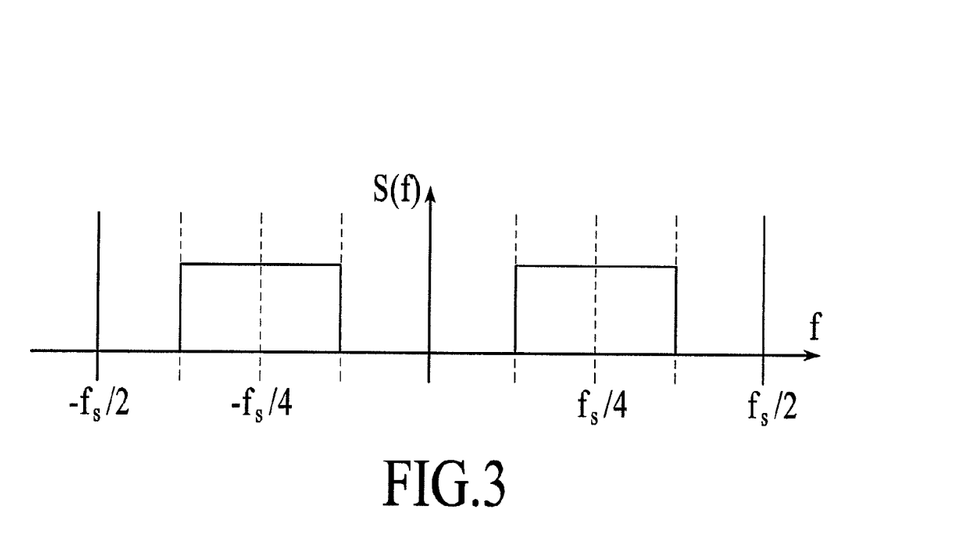
FIG. 3 is a diagram showing a spectrum centered around $f_s/4$, according to an embodiment.

For a signal centered around $f_s/4$, as illustrated in FIG. 3, which is very common in wireless systems, the example titled Skipping the first and K/2'th of K samples with K=8 applies. Here, we assume that only the spectrum in $[-3f_s/8, -1f_s/8]$ and $[+1f_s/8, +3f_s/8]$ is non-zero.

Hardware Implementation

Direct Implementation of the Decomposition

Figure 4:
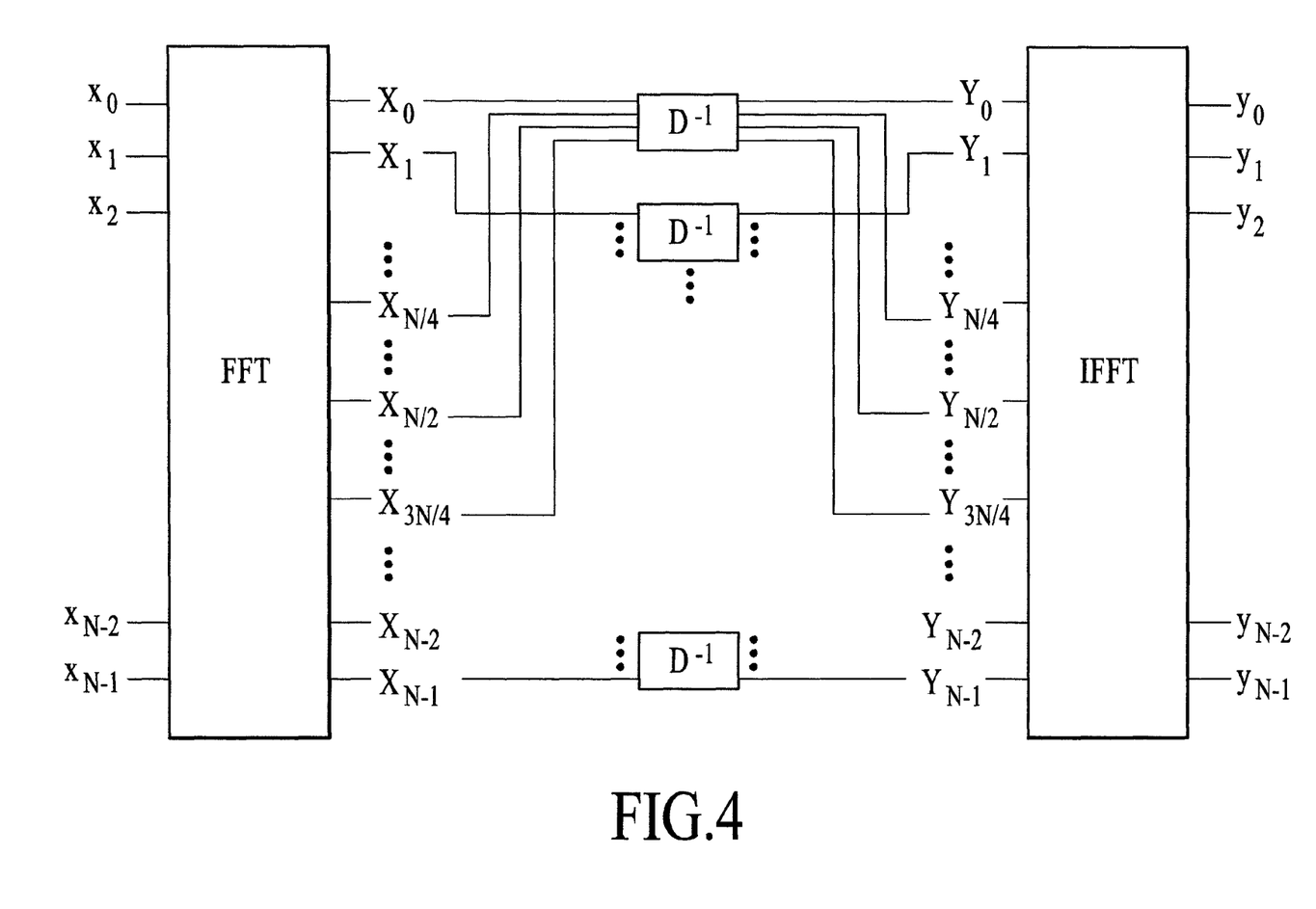
FIG. 4 is a block diagram of an implementation of signal reconstruction using digital circuitry, according to an embodiment.

A direct implementation of equation (3), combined with the expansion of equation (4), leads to the structure in FIG. 4: an FFT element, followed by a permutation element (indicated by $X_0$-$X_{N-1}$), the reconstruction kernel $D^{-1}$, the reverse permutation element (indicated by $Y_0$-$Y_{N-1}$), and finally an inverse FFT element. Here K=4.

Figure 5:
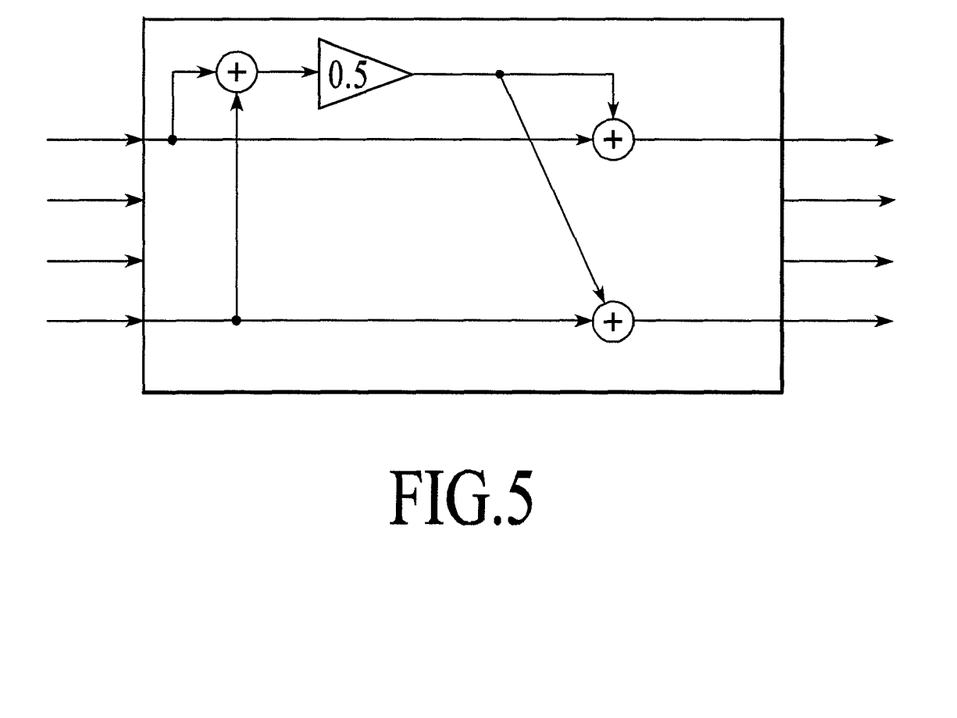
FIG. 5 is a block diagram of a low-pass reconstruction kernel for K=4, according to an embodiment.
Figure 6:
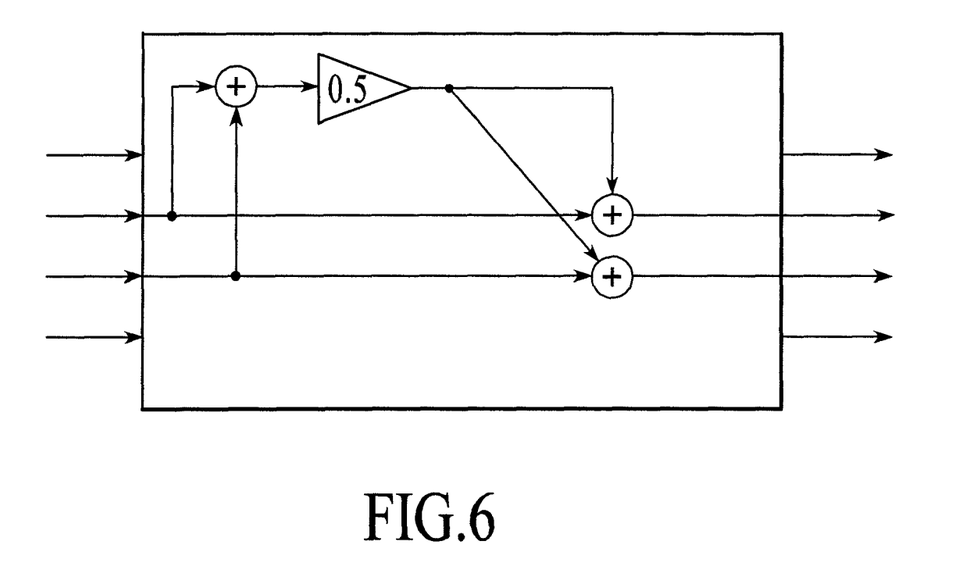
FIG. 6 is a block diagram of a high-pass reconstruction kernel for K=4, according to an embodiment.

Reconstruction kernels corresponding to formula (8) are shown in FIG. 5 and FIG. 6. Notice how only 2 of the 4 inputs from the FFT are used and how 2 of the 4 outputs to the IFFT are zero.

Figure 7:
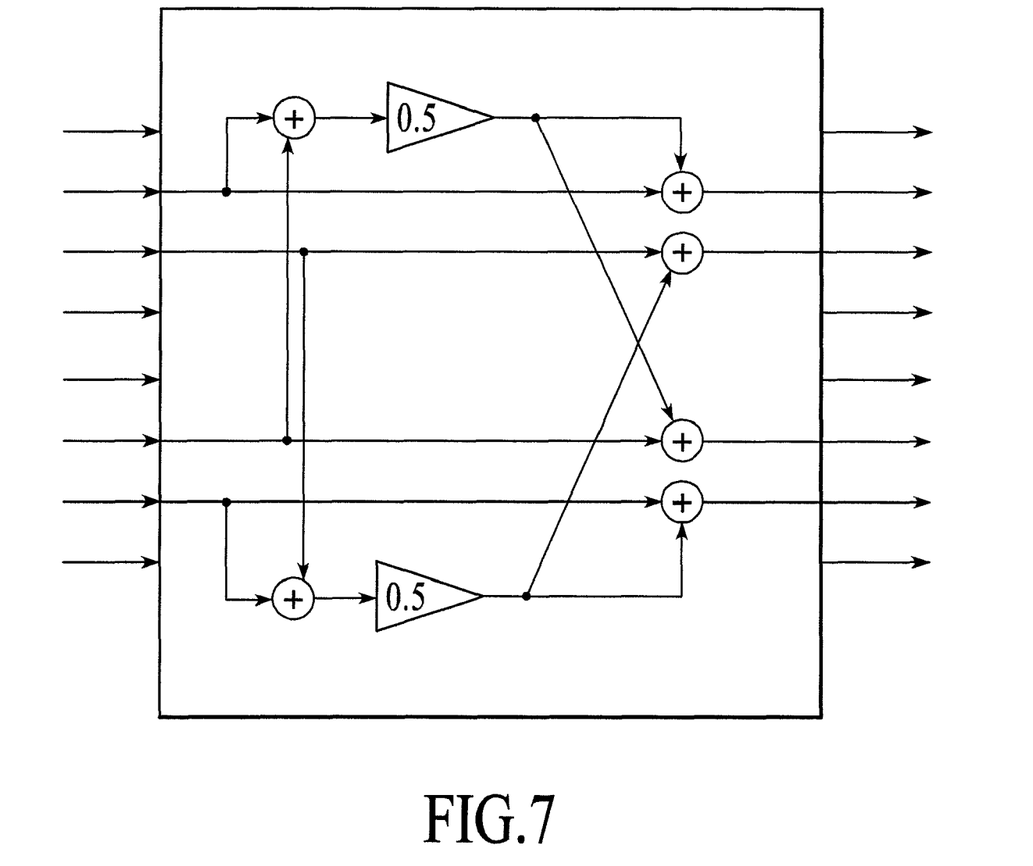
FIG. 7 is a block diagram of a band-pass reconstruction kernel for K=8, according to an embodiment.

A similar structure can be devised for K=8. The reconstruction kernel is shown in FIG. 7 and has 8 inputs, of which only 4 are used, and 8 outputs, of which 4 are zero.

Implementation Optimized Using FFT Structure

In an embodiment, the reconstruction is greatly simplified using the conventional hardware implementation structure of an FFT.

Figure 8:
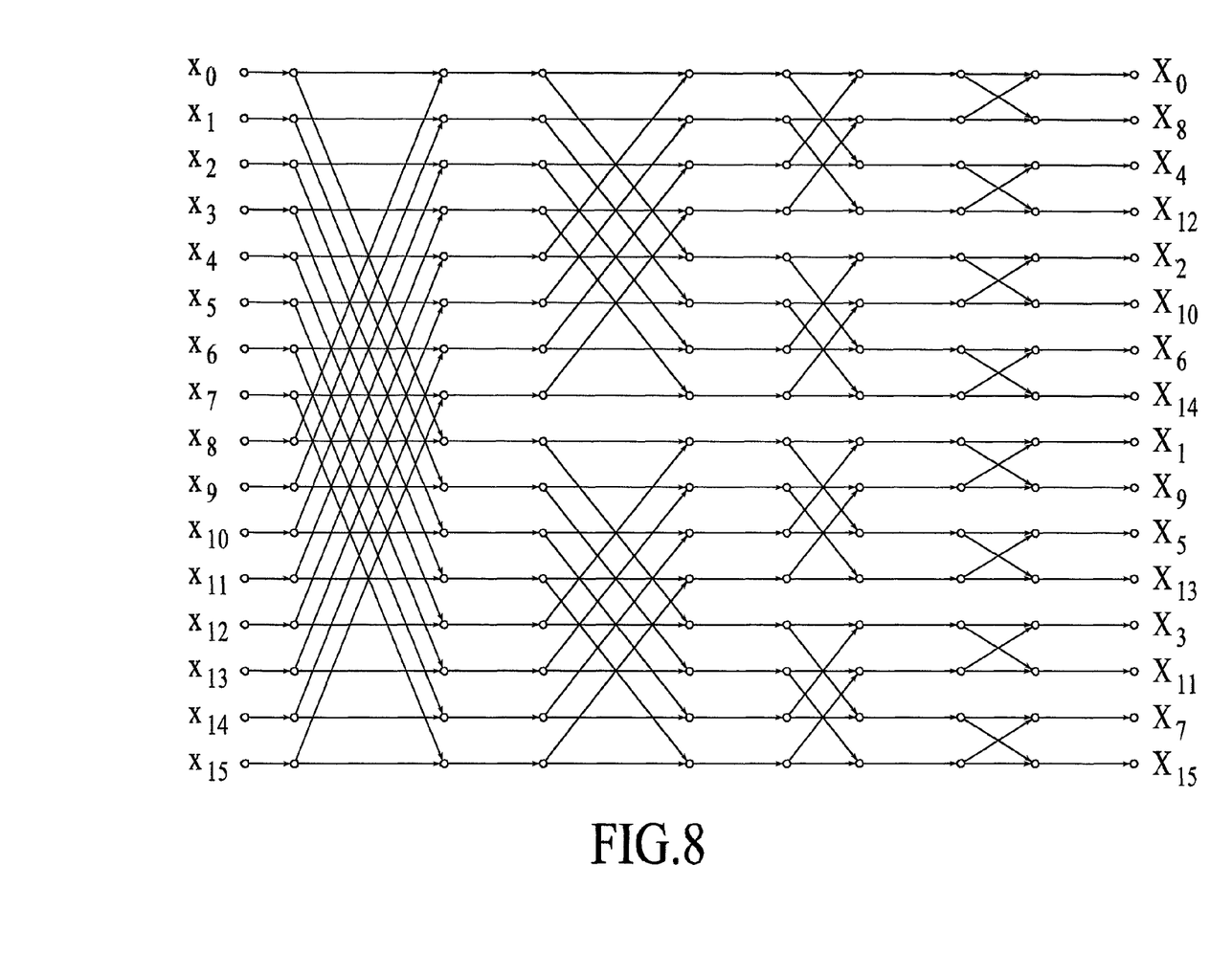
FIG. 8 is a diagram of a FFT Radix 2 structure, according to an embodiment.
Figure 9:
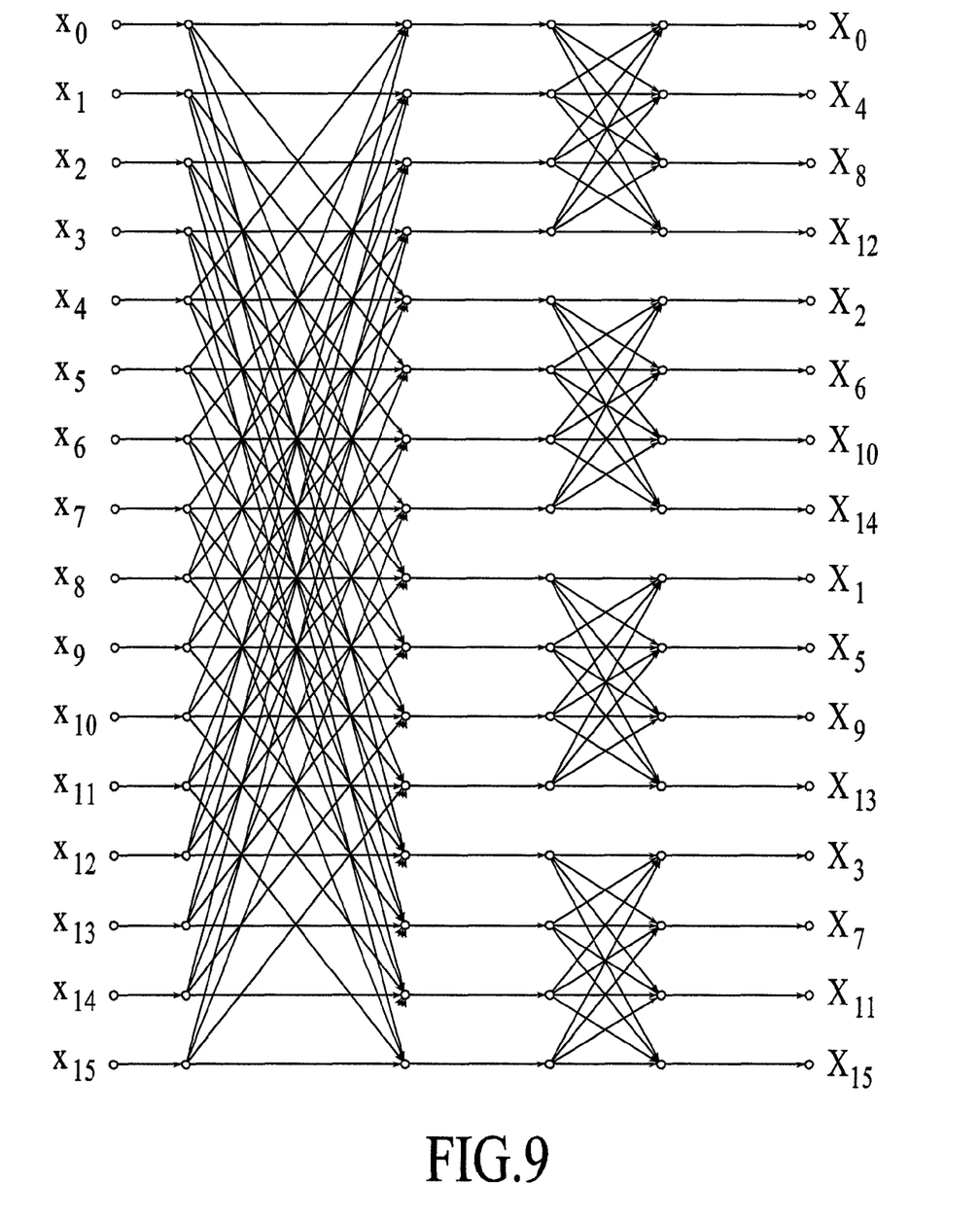
FIG. 9 is a diagram of a FFT Radix 4 structure, according to an embodiment.

FIG. 8 shows the structure of a conventional FFT with radix 2 (see for example, Oppenheim, A. V. and R. W. Schafer (1999); *Discrete-time signal processing*; New Jersey, Prentice Hall). This FFT can also be constructed using a different radix. FIG. 9 shows the structure using a radix of 4. Typically, the radix is a power of 2. If the input data is available as a stream, a stream-based FFT can be implemented in hardware (see for example: Shousheng, H. and Torkleson, M (1998). *Design and implementation of a* 1024-*point pipeline FFT processor*. Proceedings of the IEEE 1998 Custom Integrated Circuits Conference, Santa Clara, Calif., USA, IEEE; and Bass, B. M. (1999). "A low-power high-performance, 1024- point FFT Processor." *IEEE Journal of Solid-State Circuits* 34(3): 380-7), which outputs the data in the order shown in FIG. 8 (for a radix of 2) or in FIG. 9 (for a radix of 4).

Figure 10:
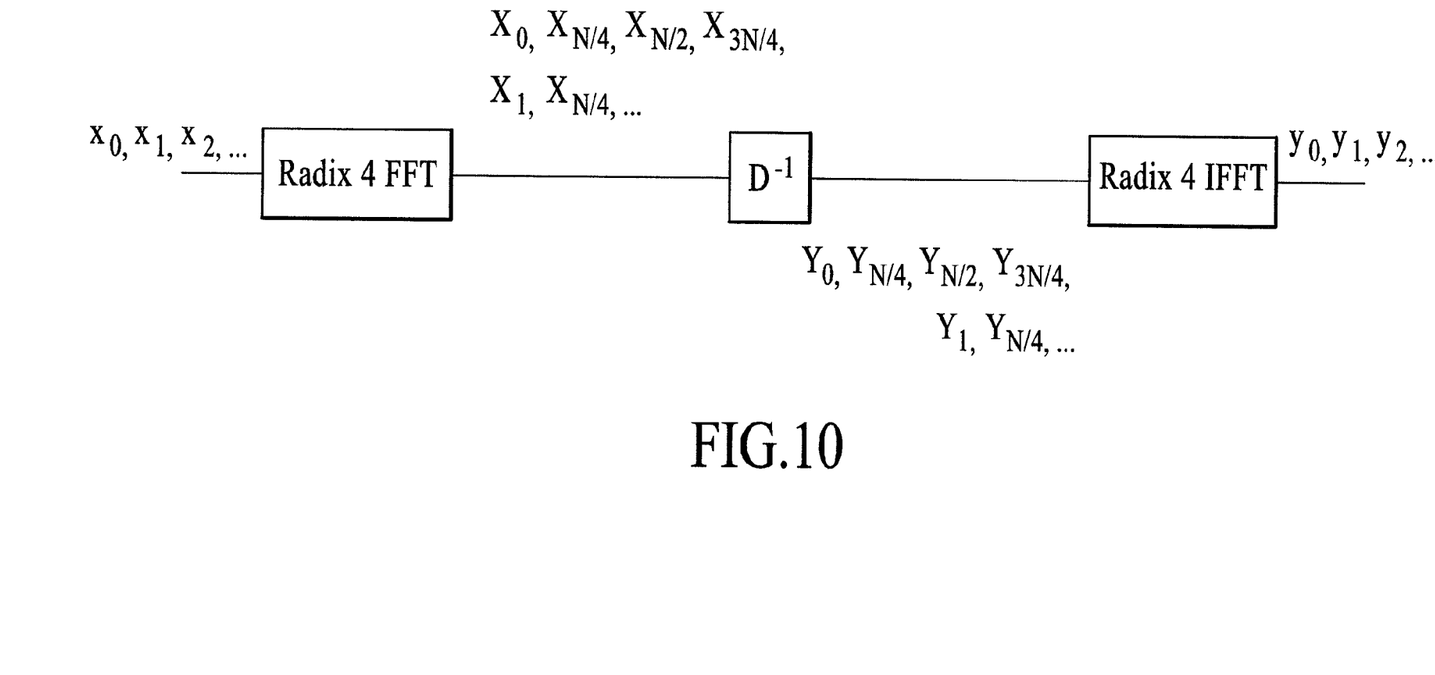
FIG. 10 is a block diagram of an optimized implementation of signal reconstruction using a stream-based FFT with a radix K, according to an embodiment.

The second element of the signal reconstruction embodiment is then to combine the reconstruction with parameter K with a radix K FFT and a radix K IFFT. This will eliminate altogether the need for the permutation matrices, which would require a large amount of memory to reshuffle the data. Additionally, only one reconstruction kernel $D^{-1}$ is needed. FIG. 10 shows an optimized implementation of the reconstruction using a stream-based FFT implementation with radix K.

As an illustration of this optimization, notice how the order of the outputs of the radix 4 FFT structure in FIG. 9 is in exactly the same order as the inputs to the different $D^{-1}$ reconstruction kernels in FIG. 4.

Aspects of the methods described herein may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Embodiments may also be implemented as microcontrollers with memory (such as electrically erasable programmable read-only memory ("EEPROM")), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, etc.

The various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., hypertext transfer protocol ("HTTP"), file transfer protocol ("FTP"), simple mail transfer protocol ("SMTP"), etc.).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list; all of the items in the list; and any combination of the items in the list.

The above description of illustrated embodiments is not intended to be exhaustive or limited by the disclosure. While specific embodiments of, and examples are described herein for illustrative purposes, various equivalent modifications are possible, as those skilled in the relevant art will recognize. The teachings provided herein can be applied to other systems and methods, and not only for the systems and methods described above. The elements and acts of the various embodiments described above can be combined to provide further embodiments. These and other changes can be made to methods and systems in light of the above detailed description.

In general, in the following claims, the terms used should not be construed to be limited to the specific embodiments disclosed in the specification and the claims, but should be construed to include all systems and methods that operate under the claims. Accordingly, the method and systems are not limited by the disclosure, but instead the scope is to be determined entirely by the claims. While certain aspects are presented below in certain claim forms, the inventors contemplate the various aspects in any number of claim forms.

The invention claimed is:

1. A method of sharing an analog-to-digital converter (ADC) between paths with different sampling rates in a wireless communication system, the method comprising:
   receiving a periodically non-uniformly sampled signal, wherein the sampled signal is considered in the time-domain signal and in the frequency-domain;
   dividing the signal in the time-domain in M periods of K length;
   dividing the signal in the frequency-domain in K groups of length M, wherein one in every K samples is missing for each sampling period and K is a Fast Fourier Transform (FFT) radix value, and further wherein at least one of the groups is zero and that the number of zero groups is larger than the number of missing time-domain samples per period; and
   applying a radix K FFT and radix K IFFT to reconstruct the signal.

2. The method of claim 1, wherein the signal is centered around DC, the method further comprising skipping a first sample in four samples of a period.

3. The method of claim 1, wherein the signal is centered around $f_s/4$, the method further comprising skipping a first sample and a K/2'th sample of K samples.

4. A signal reconstructing system including a reconstruction kernel configured to:
   receive a periodically non-uniformly sampled signal, wherein the sampled signal is considered in the time-domain signal and in the frequency-domain;
   divide the signal in the time-domain in M periods of K length;
   divide the signal in the frequency-domain in K groups of length M, wherein one in every K samples is missing for each sampling period and K is a Fast Fourier Transform (FFT) radix value, and further wherein at least one of the groups is zero and that the number of zero groups is larger than the number of missing time-domain samples per period; and apply a radix K FFT and radix K IFFT to reconstruct the signal.

5. The system of claim 4, wherein the radix K IFFT is coupled to receive an output of the reconstruction kernel and to output a result to an analog-to-digital converter, wherein the analog-to-digital converter is shared among a plurality of signals in a wireless communication system.

6. The system of claim 4, wherein the reconstruction kernel is further configured to skip a first sample in each period of K samples.

7. The system of claim 4, wherein the reconstruction kernel is further configured to skip a first sample and a K/2'th sample of K samples.

8. The system of claim 4, wherein the signal is centered around DC, and wherein the reconstruction kernel is further configured to skip a first sample in four samples of a period.

9. The system of claim 4, wherein the signal is centered around $f_s/4$, and wherein the reconstruction kernel is further configured to skip a K/2'th sample of K samples.

* * * * *